(12) United States Patent
Penny et al.

(10) Patent No.: US 10,770,653 B1
(45) Date of Patent: Sep. 8, 2020

(54) SELECTIVE DIELECTRIC DEPOSITION TO PREVENT GOUGING IN MRAM

(71) Applicant: INTERNATIONAL BUSINESS MACHINES CORPORATION, Armonk, NY (US)

(72) Inventors: Christopher J. Penny, Saratoga Springs, NY (US); Marc A. Bergendahl, Rensselaer, NY (US); Michael Rizzolo, Delmar, NY (US); Christopher J. Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/515,461

(22) Filed: Jul. 18, 2019

(51) Int. Cl.
*H01L 43/12* (2006.01)
*G11C 11/16* (2006.01)
*H01L 27/22* (2006.01)

(52) U.S. Cl.
CPC ............ *H01L 43/12* (2013.01); *G11C 11/161* (2013.01); *H01L 27/222* (2013.01)

(58) Field of Classification Search
CPC ...... H01L 43/12; H01L 27/222; G11C 11/161
See application file for complete search history.

(56) References Cited

U.S. PATENT DOCUMENTS

| | | | |
|---|---|---|---|
| 6,946,698 B1 | 9/2005 | Lin | |
| 8,334,213 B2 | 12/2012 | Mao | |
| 8,815,674 B1 | 8/2014 | Reimer et al. | |
| 9,287,495 B2 | 3/2016 | Tomioka | |
| 9,595,444 B2 | 3/2017 | Yokota et al. | |
| 9,627,608 B2 | 4/2017 | Draeger et al. | |
| 10,147,875 B1 | 12/2018 | Hansen et al. | |
| 10,243,020 B1* | 3/2019 | Clevenger | H01L 27/228 |
| 2005/0023581 A1* | 2/2005 | Nuetzel | H01L 27/228 257/295 |
| 2008/0090307 A1 | 4/2008 | Xiao et al. | |
| 2009/0078927 A1 | 3/2009 | Xiao et al. | |
| 2010/0311243 A1 | 12/2010 | Mao | |
| 2015/0325622 A1* | 11/2015 | Zhang | H01L 43/08 257/421 |
| 2016/0093668 A1 | 3/2016 | Lu et al. | |
| 2016/0133828 A1 | 3/2016 | Lu et al. | |
| 2017/0018704 A1* | 1/2017 | Chuang | H01L 43/12 |
| 2019/0386210 A1* | 12/2019 | Rizzolo | H01L 43/02 |
| 2020/0105829 A1* | 4/2020 | Boone | H01L 43/12 |
| 2020/0106006 A1* | 4/2020 | Boone | H01F 41/34 |
| 2020/0127194 A1* | 4/2020 | Rizzolo | H01L 43/12 |

* cited by examiner

Primary Examiner — Victor A Mandala
(74) Attorney, Agent, or Firm — Tutunjian & Bitetto, P.C.; Vazken Alexanian

(57) ABSTRACT

A method is presented for reducing dielectric gouging during etching processes of a magnetoresistive random access memory (MRAM) structure including an MRAM region and a non-MRAM region. The method includes forming protective layers in the MRAM region to preserve integrity of underlying dielectric layers, forming a bottom electrode in direct contact with the protective layers, and constructing an MRAM pillar over the bottom electrode, wherein the MRAM pillar includes a magnetic tunnel junction (MTJ) stack and a top electrode.

7 Claims, 8 Drawing Sheets

SELECTIVE DIELECTRIC DEPOSITION TO PREVENT GOUGING IN MRAM

BACKGROUND

The present invention relates generally to semiconductor devices, and more specifically, to selective dielectric deposition to prevent gouging in magnetoresistive random access memory (MRAM) applications.

Unlike conventional random access memory (RAM) chip technologies, magnetic or magnetoresistive RAM (MRAM) does not store data as electric charge, but instead stores data by magnetic polarization of storage elements. Usually, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (e.g., anti-parallel polarity to the fixed layer) or "0" (e.g., parallel polarity to the fixed layer). One device having a fixed layer, a tunneling layer, and a free layer is a magnetic tunnel junction.

SUMMARY

In accordance with an embodiment, a method is provided for reducing dielectric gouging during etching processes of a magnetoresistive random access memory (MRAM) structure including an MRAM region and a non-MRAM region. The method includes forming protective layers in the MRAM region to preserve integrity of underlying dielectric layers, forming a bottom electrode in direct contact with the protective layers, and constructing an MRAM pillar over the bottom electrode, wherein the MRAM pillar includes a magnetic tunnel junction (MTJ) stack and a top electrode.

In accordance with another embodiment, a method is provided for reducing dielectric gouging during etching processes of a magnetoresistive random access memory (MRAM) structure including an MRAM region and a non-MRAM region. The method includes forming a plurality of first conductive lines within a first dielectric at a first metal level, forming a plurality of second conductive lines within a second dielectric at a second metal level, wherein the first and second metal levels are connected by a via, depositing a first hardmask and a second hardmask, etching the first and second hardmasks to expose top surfaces of one or more of the plurality of second conductive lines, and constructing protective layers in the MRAM region to preserve integrity of underlying dielectric layers, wherein the protective layers are misaligned with respect to conductive lines of the plurality of first and second conductive lines in the first and second metal levels, respectively.

In accordance with yet another embodiment, a semiconductor device is provided for reducing dielectric gouging during etching processes of a magnetoresistive random access memory (MRAM) structure including an MRAM region and a non-MRAM region. The semiconductor device includes protective layers disposed in the MRAM region to preserve integrity of underlying dielectric layers, a bottom electrode disposed in direct contact with the protective layers, and an MRAM pillar disposed over the bottom electrode, wherein the MRAM pillar includes a magnetic tunnel junction (MTJ) stack and a top electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing magnetoresistive random access memory (MRAM) without gouging of underlying dielectrics during magnetic tunnel junction (MTJ) pillar etch processes. Etch and patterning challenges for MRAM applications are addressed by allowing the non-MRAM areas to be protected by selective dielectric deposition or dielectric protectors. In particular, after MRAM and non-MRAM patterning, selective dielectric deposition is employed to protect the non-MRAM areas. This masking allows for removal of the MRAM hardmask materials during etching while reducing the MRAM stack and reducing the impact of ion beam etches outside the MRAM areas. Thus, a combination of MRAM and non-MRAM features in a single level can be achieved to integrate MRAM in chips with existing semiconductor technologies without the need of employing high ion energy etches that can have negative effects for non-MRAM features.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
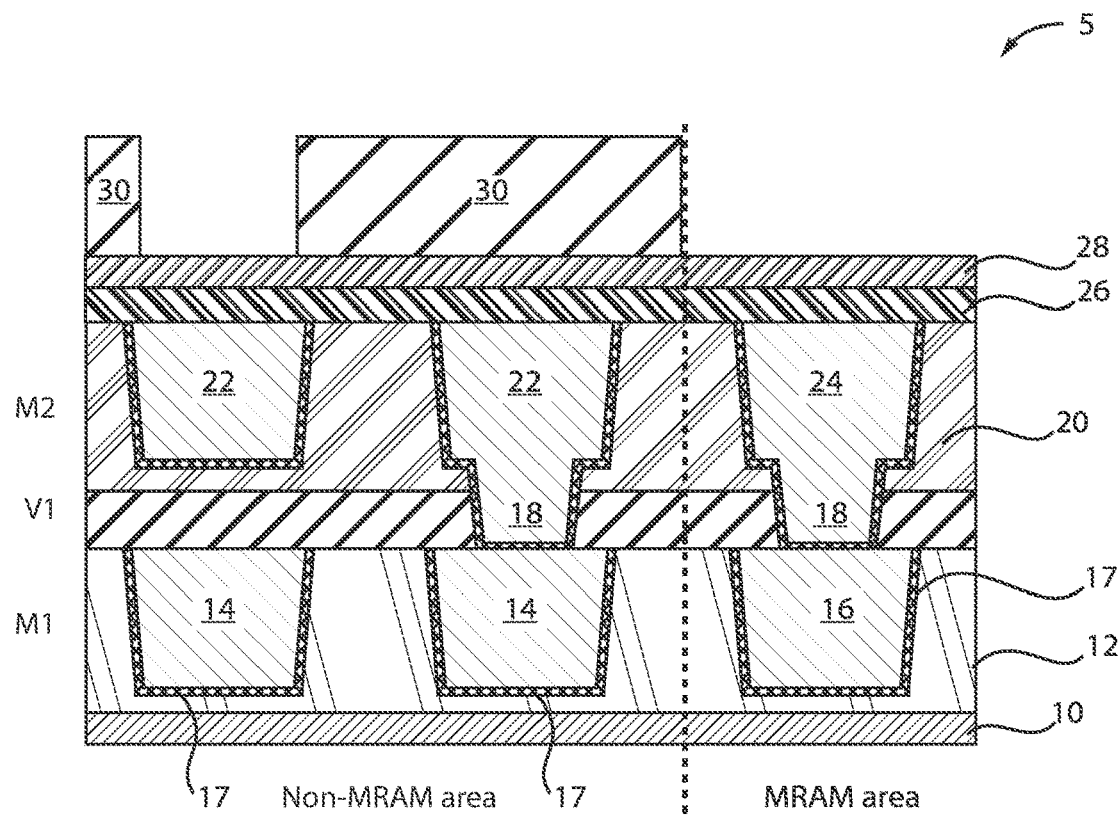
FIG. 1 is a cross-sectional view of a semiconductor structure including a plurality of conductive lines formed within dielectric layers, hardmasks formed over the magnetoresistive random access memory (MRAM) and non-MRAM regions, and a block mask formed in a non-MRAM area, the block mask removed and the hardmasks etched, in accordance with an embodiment of the present invention.
Figure 1:
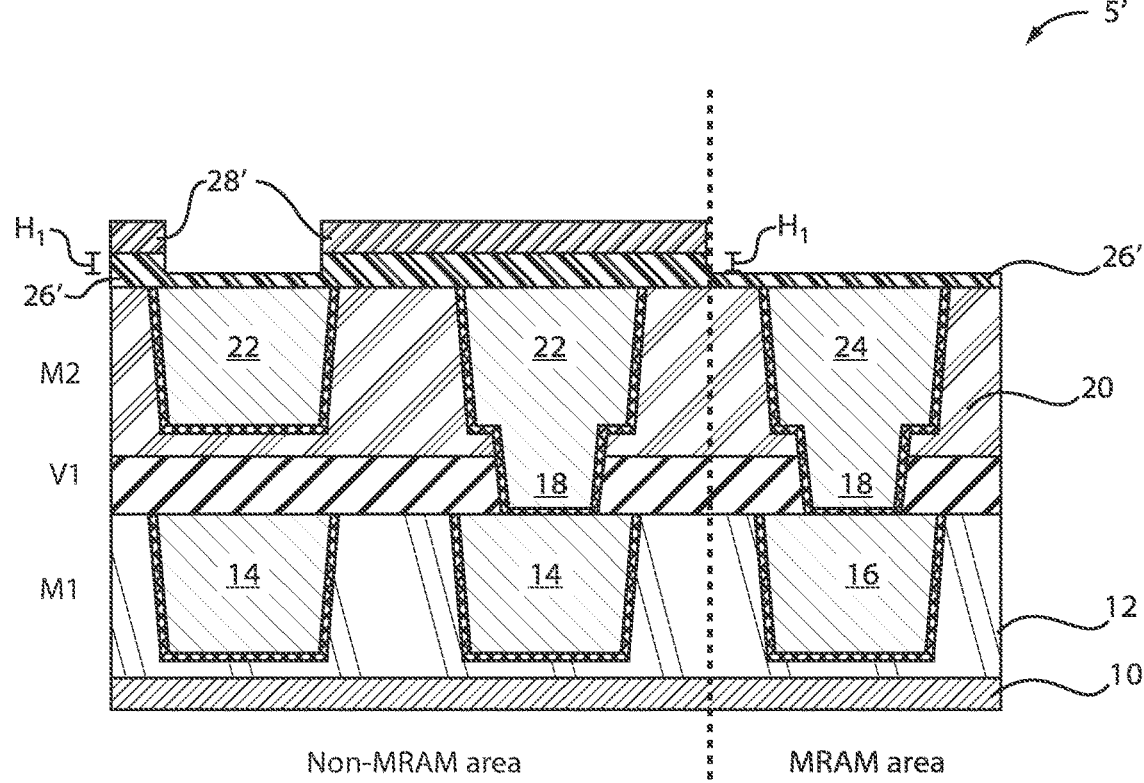

FIG. 1 is a cross-sectional view of a semiconductor structure including a plurality of conductive lines formed within dielectric layers, hardmasks formed over the MRAM and non-MRAM regions, and a block mask formed in a non-MRAM area, the block mask removed and the hardmasks etched, in accordance with an embodiment of the present invention.

In various exemplary embodiments, structure 5 includes a plurality of conductive lines 14, 16 formed within trenches of an inter-layer dielectric (ILD) 12. The ILD 12 can be formed over a substrate 10. A conductive fill material or liner 17 can be formed or deposited around each of the trenches.

Conductive lines 14, 16 are defined at metal level (M1). Conductive lines 22, 24 are formed within trenches of ILD 20. A conductive fill material or liner 17 can be formed or deposited around each of the trenches. Conductive lines 22, 24 are defined at metal level (M2). Metal level (M1) is connected to metal level (M2) by via 18.

A first hardmask 26 and a second hardmask 28 are formed over the M2 level in both the non-MRAM area and the MRAM area of structure 5. A block mask 30 is formed in the non-MRAM area only.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 12, 20 can include any materials known in the art, such as, for example, porous silicates, carbon doped oxides, silicon dioxides, silicon nitrides, silicon oxynitrides, or other dielectric materials. The ILD 12, 20 can be formed using any method known in the art, such as, for example, chemical vapor deposition, plasma enhanced chemical vapor deposition, atomic layer deposition, or physical vapor deposition. The ILD 12, 20 can have a thickness ranging from about 25 nm to about 200 nm.

The dielectric material of layer 12, 20 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 14, 16, 22, 24 can be formed in the openings or trenches formed in the ILDs 12, 20. The metal lines 14, 16, 22, 24 can be any conductive materials known in the art, such as, for example, copper (Cu), aluminum (Al), or tungsten (W). The metal lines 14, 16, 22, 24 can be fabricated using any technique known in the art, such as, for example, a single or dual damascene technique. In an embodiment, the metal lines 14, 16, 22, 24 can be copper (Cu) and can include a metal liner 17, where the metal liner 17 can be metals, such as, for example, tantalum nitride and tantalum (TaN/Ta), titanium, titanium nitride, cobalt, ruthenium, and manganese.

In one example, the liner 17 can be a tantalum nitride (TaN) liner or in the alternative a tantalum (Ta) liner. In one example embodiment, the conductive fill material 17 can be deposited, for example, by electroplating, electroless plating, chemical vapor deposition (CVD), atomic layer deposition (ALD) and/or physical vapor deposition (PVD).

The first hardmask 26 can be, e.g., a dielectric hardmask, whereas the second hardmask 28 can be, e.g., a metal hardmask.

The dielectric hardmask 26 can include a dielectric oxide or dielectric nitride. In one embodiment, the dielectric hardmask 26 includes silicon dioxide. The dielectric hardmask 26 can be formed, for example, by CVD, PECVD or ALD. The thickness of the dielectric hardmask 26 can be from about 10 nm to about 50 nm, although lesser and greater thicknesses can also be employed.

The metal hardmask 28 can include one or more conductive materials. The material forming the hardmask 28 can be deposited by employing a deposition process, for example, PVD, ion beam deposition (IBD), or other like processes. Non-limiting examples of conductive materials for the hardmask 28 include tantalum nitride, titanium, titanium nitride, or any combination thereof.

In various exemplary embodiments, in structure 5' the block mask 30 is removed using one of a variety of techniques known to one of skill in the art, and exposed portions of the metal hardmask 28 are etched. Remaining portions 28' and remaining portions 26' are present after the etch. The dielectric hardmask 26 can be etched by an amount designated by height "$H_1$."

The hardmask 28 can be etched by, for example, employing a reactive ion etch (RIE) process or a halogen-based chemical etch process (e.g., including chlorine-containing gas and/or fluorine-containing gas chemistry). The hardmask 28 and the hardmask 26 are etched at different rates such that initially the hardmask 28 is etched and the hardmask 26 remains un-etched or partially etched (as shown).

Figure 2:
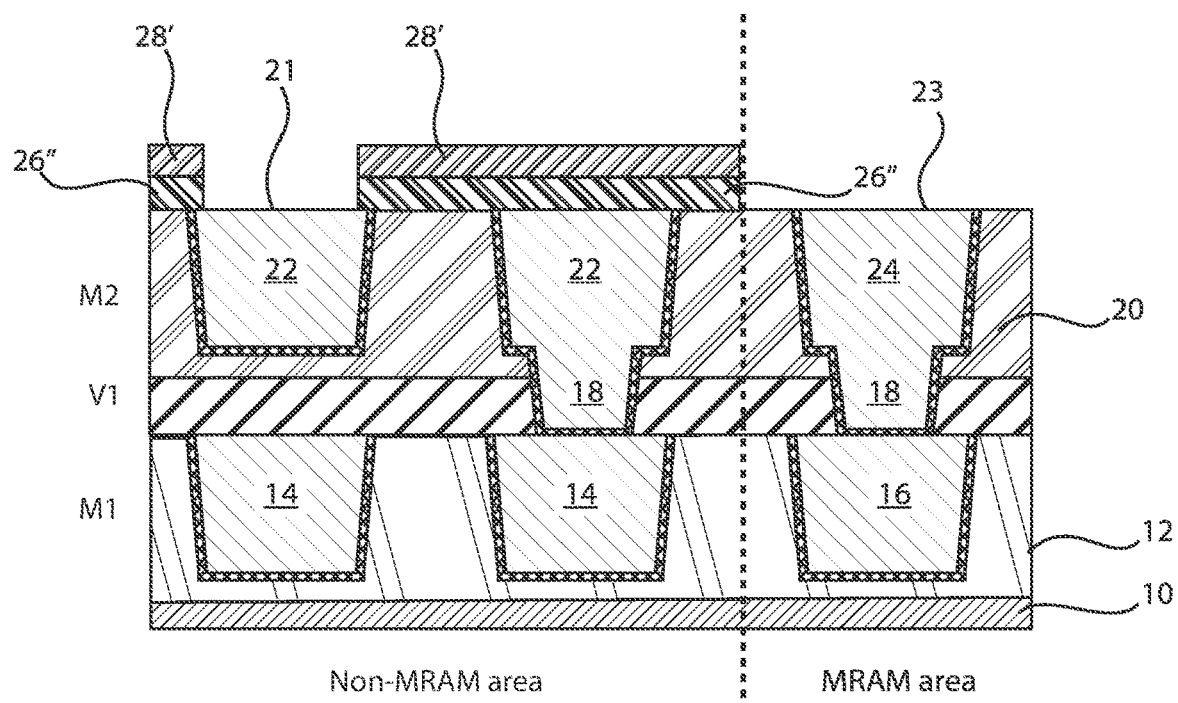
FIG. 2 is a cross-sectional view of the semiconductor structure of FIG. 1 where the hardmasks are further etched to expose top surfaces of one or more of the plurality of conductive lines and dielectric protectors are selectively formed in the MRAM area, in accordance with an embodiment of the present invention.
Figure 2:
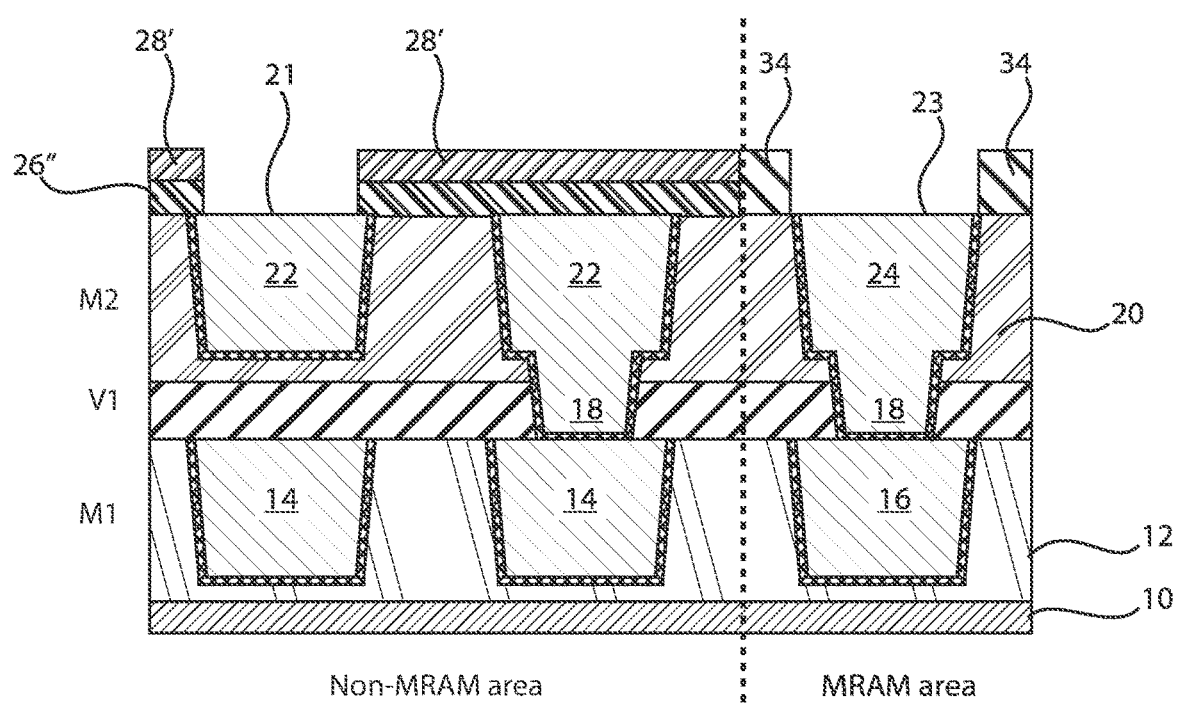

FIG. 2 is a cross-sectional view of the semiconductor structure of FIG. 1 where the hardmasks are further etched to expose top surfaces of one or more of the plurality of conductive lines and dielectric protectors are selectively formed in the MRAM area, in accordance with an embodiment of the present invention.

In various exemplary embodiments, in structure 35, the exposed hardmask portions 26' are removed to expose a top surface 21 of conductive line 22 in the non-MRAM region and to expose a top surface 23 of conductive line 24 in the MRAM region. The remaining hardmask sections are designated as 26".

The etch can, for example, include a wet etch such as a phosphoric acid ($H_3PO_4$) (wet chemistry) etch or a diluted hydrogen fluoride (HF) etch.

In various exemplary embodiments, in structure 35', dielectric regions 34 are selectively deposited in the MRAM region. The dielectric regions 34 are vertically offset or misaligned from the conductive line 24. In other words, the dielectric regions 34 do not contact the conductive line 24. It is noted that the selective deposition material need not be coplanar with the hardmask 28'. The dielectric regions 34 can be referred to as protective regions or protective areas or protective layers or protectors.

The selectively deposited dielectric material of regions 34 can include, but is not limited to, ultra-low-k (ULK) materials, such as, for example, porous silicates, carbon doped oxides, silicon oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4. The dielectric material of regions 34 can further include aluminum oxides and hafnium oxides. In one preferred example, the dielectric regions 34 can be aluminum oxide ($Al_2O_3$). $Al_2O_3$ is an excellent etch stop layer that provides significant reductions in gouging relative to low-k dielectrics needed to achieve low capacitance in the standard back end-of-the-line (BEOL) processing.

Figure 3:
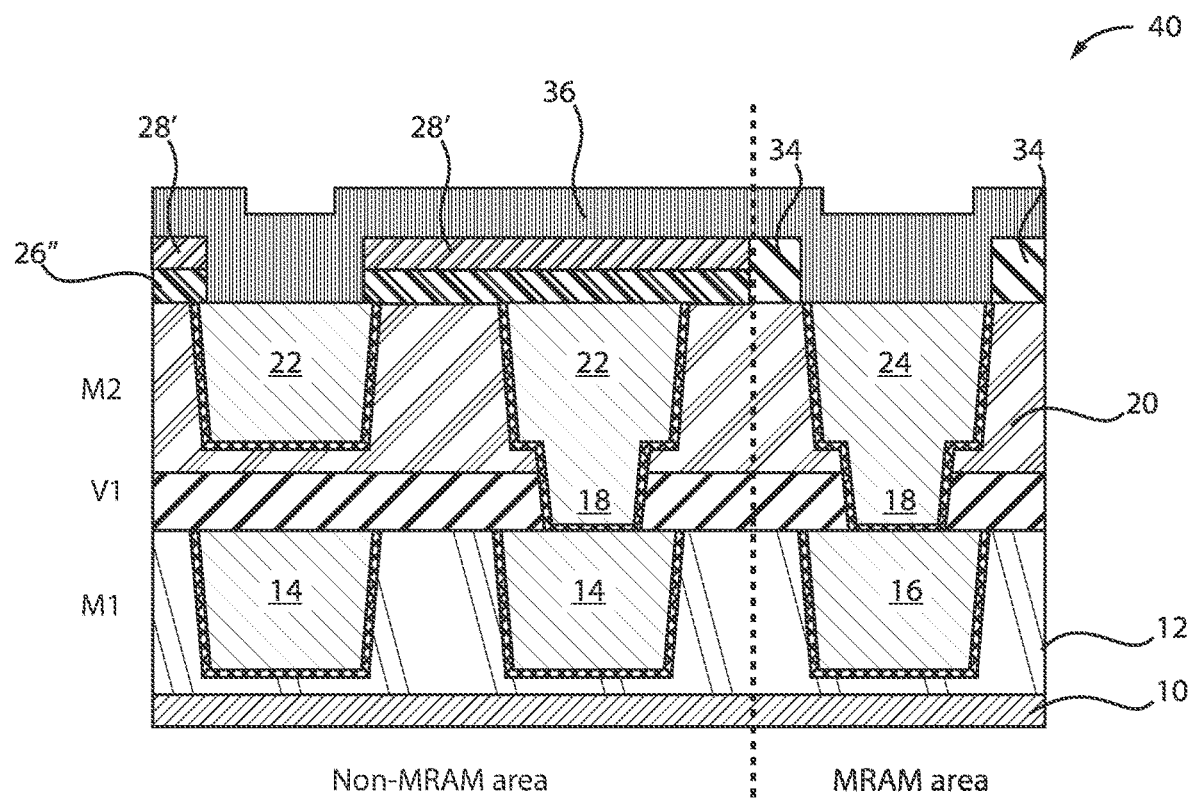
FIG. 3 is a cross-sectional view of the semiconductor structure of FIG. 2 where a bottom electrode is formed and reduced by chemical-mechanical polishing (CMP), in accordance with an embodiment of the present invention.
Figure 3:
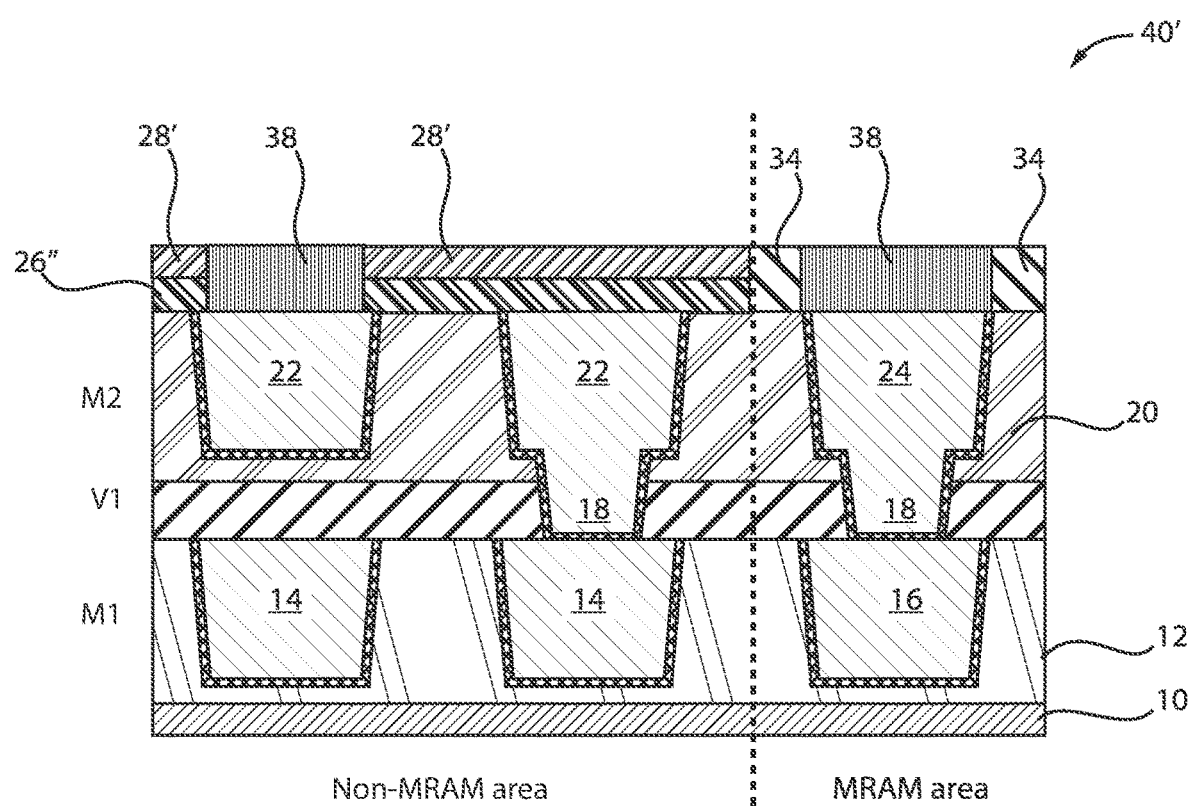

FIG. 3 is a cross-sectional view of the semiconductor structure of FIG. 2 where a bottom electrode is formed and reduced by chemical-mechanical polishing (CMP), in accordance with an embodiment of the present invention.

In various exemplary embodiments, in structure 40, a bottom electrode 36 is deposited.

The bottom electrode 36 can be, e.g., formed from Ta, Ti/TiN, W, WN, TaN, polysilicon, doped polysilicon, amorphous silicon, doped amorphous silicon, or any other suitable material, or any other conductive material. Alternatively, the bottom electrode 36 can be, e.g., any suitable conductive material or materials, e.g., Ag, Al, Cu, TaN, Ti, TiN, Al or any other suitable material, and can be deposited or formed in any suitable manner.

In various exemplary embodiments, in structure 40', the bottom electrode 36 is reduced by CMP such that bottom electrode portions 38 remain. Thus, a top surface of the bottom electrode portions 38 is flush with the top surface of the metal hardmask 28'. The bottom electrode portions 38 can be flush with the top surface of the dielectric protectors 34.

Figure 4:
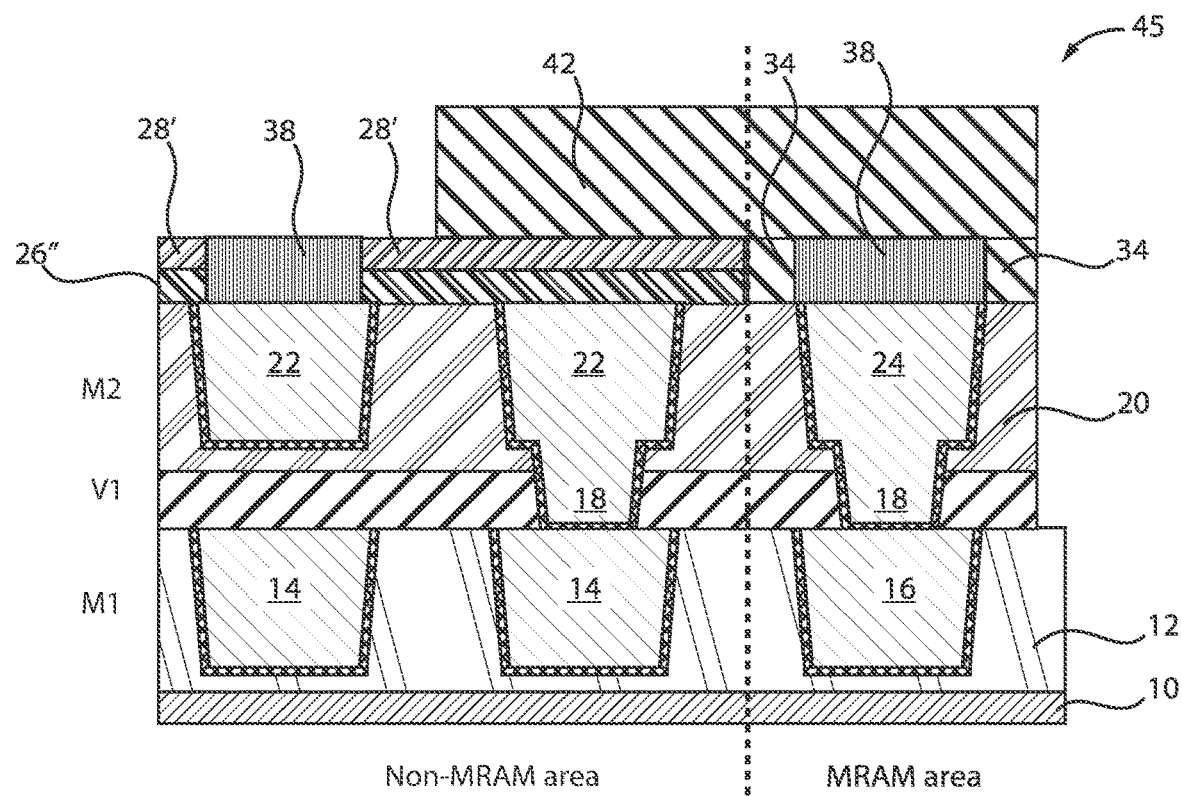
FIG. 4 is a cross-sectional view of the semiconductor structure of FIG. 3 where a block mask is deposited and an alignment aid mask etch is performed, in accordance with an embodiment of the present invention.
Figure 4:
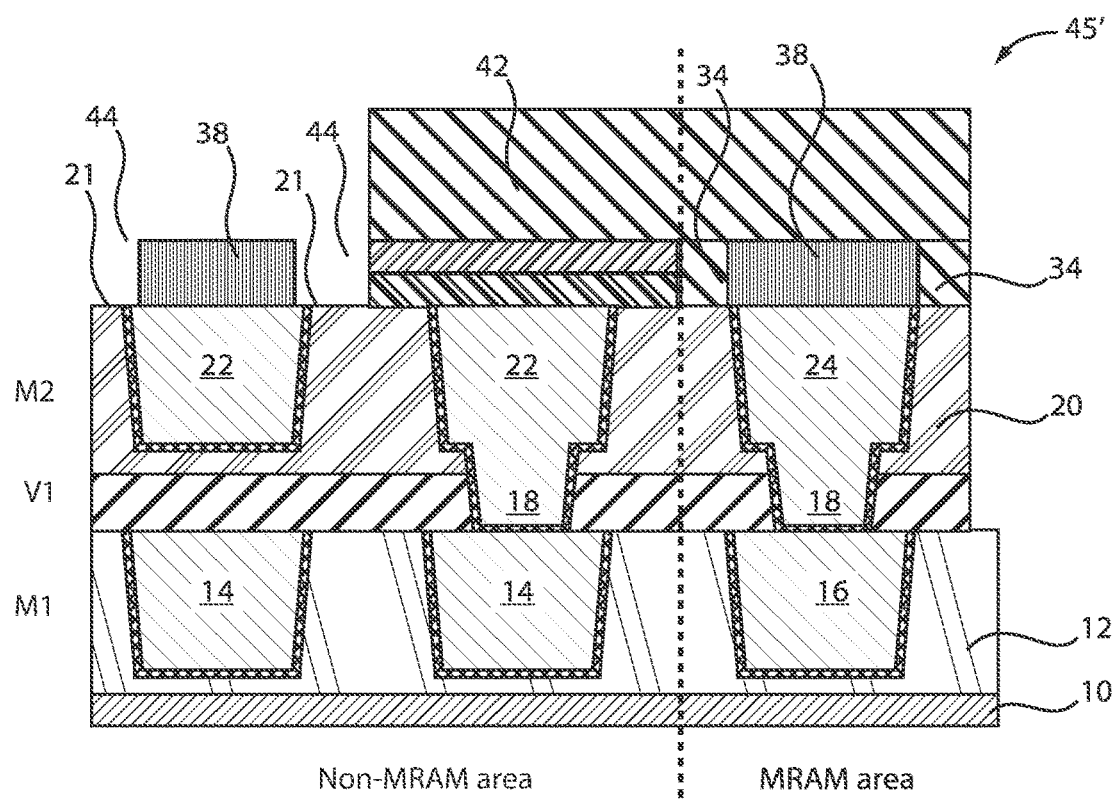

FIG. 4 is a cross-sectional view of the semiconductor structure of FIG. 3 where a block mask is deposited and an alignment aid mask etch is performed, in accordance with an embodiment of the present invention.

In various exemplary embodiments, in structure 45, a block mask 42 is deposited in the MRAM region and in parts of the non-MRAM region. Block mask 42 can be referred to as an alignment-aid mask.

In various exemplary embodiments, in structure 45', the exposed hardmask portions 26" and 28' are removed. Thus, an alignment aid mask etch is performed to add topography to selected alignment or overlay marks, while protecting BEOL and MRAM metals from oxidation. This results in exposure of a top surface 21 of the conductive line 22 of the ILD 20. Additionally, areas or regions 44 adjacent the sidewalls of the bottom electrode portion 38 are defined.

Figure 5:
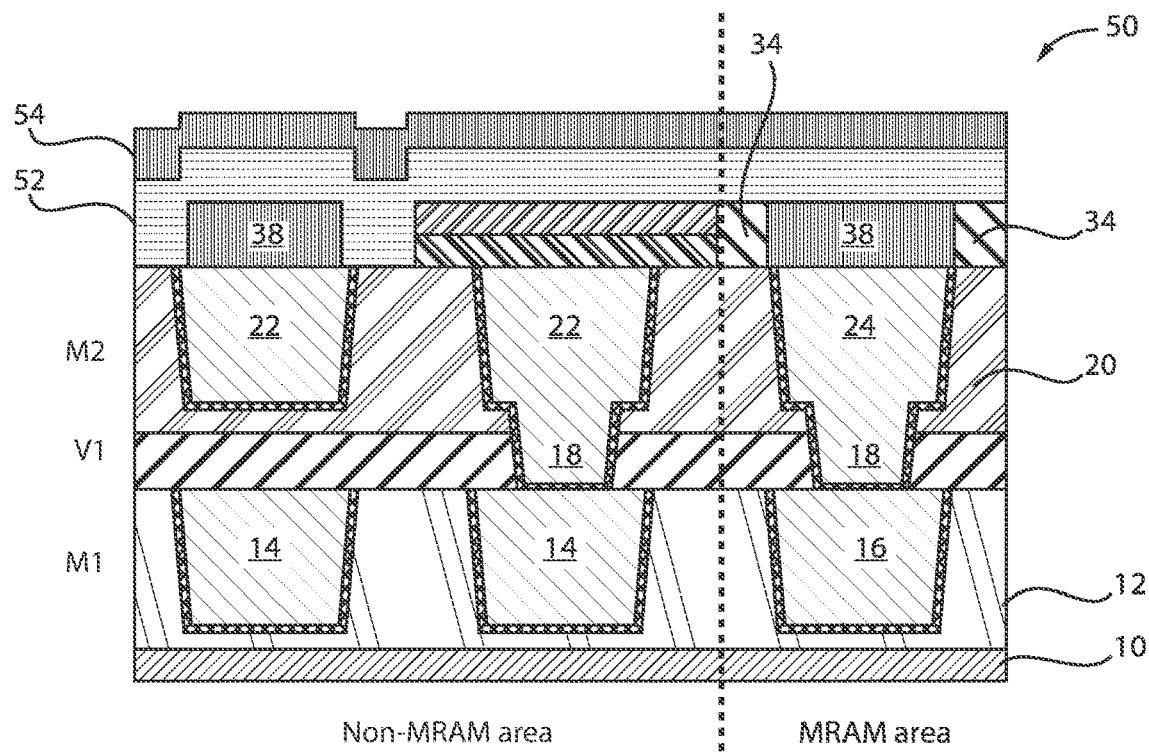
FIG. 5 is a cross-sectional view of the semiconductor structure of FIG. 4 where a magnetic tunnel junction (MTJ) stack, a top electrode, and a lithography stack are deposited, in accordance with an embodiment of the present invention.
Figure 5:
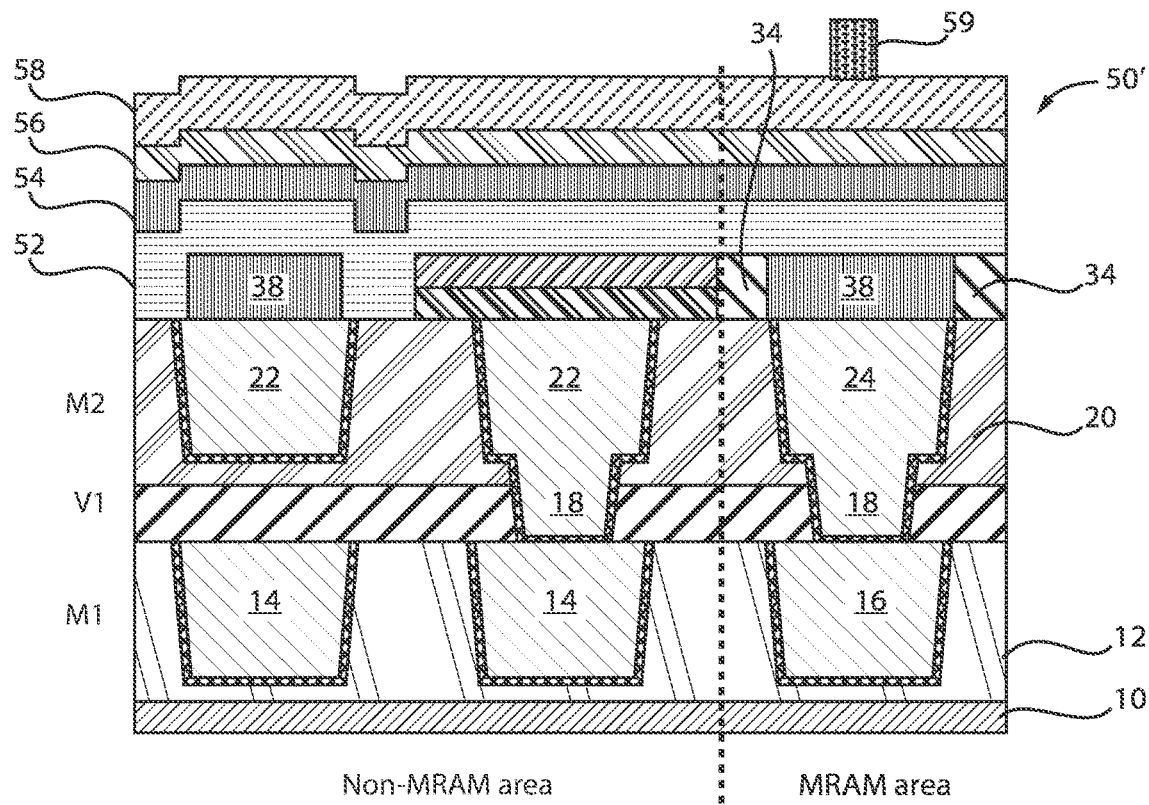

FIG. 5 is a cross-sectional view of the semiconductor structure of FIG. 4 where a magnetic tunnel junction (MTJ) stack, a top electrode, and a lithography stack are deposited, in accordance with an embodiment of the present invention.

In various exemplary embodiments, in structure 50, a top electrode 52 and an MTJ stack 54 are formed.

The top electrode 52 can be, e.g., formed from Ta, Ti/TiN, W, WN, TaN, polysilicon, doped polysilicon, amorphous silicon, doped amorphous silicon, or any other suitable material, or any other conductive material. Alternatively, the top electrode 52 can be, e.g., any suitable conductive material or materials, e.g., Ag, Al, Cu, TaN, Ti, TiN, Al or any other suitable material, and can be deposited or formed in any suitable manner.

The MTJ 54 includes two or more layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive.

MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information.

In various exemplary embodiments, in structure 50', an organic planarization layer 56, an antireflective hard mask layer 58, and a photoresist 59 are deposited.

The OPL 56 can include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the OPL 56 forms a planar horizontal surface. Exemplary organic planarization materials include, but are not limited to, near-frictionless carbon (NFC) material, diamond-like carbon, polyarylene ether, and polyimide. The OPL 56 can be deposited, for example, by spin coating. The thickness of the OPL 56 can be from about 100 nm to about 500 nm, although lesser and greater thicknesses can also be employed.

The antireflective hard mask layer 58 is formed on the OPL 56. The antireflective hard mask layer 58 can include an antireflective coating material. The antireflective hard mask layer 58 is employed in the lithographic process to improve the photoresist profile and to reduce the line width variation caused by scattering and reflecting light. The antireflective hard mask layer 58 can include a silicon-containing antireflective coating (SiARC) material, a titanium-containing antireflective coating material (TiARC), silicon nitride, silicon oxide or TiN. In one embodiment, the antireflective hard mask layer 58 includes a SiARC material. The antireflective hard mask layer 58 can be applied, for example, by spin coating or CVD. The thickness of the antireflective hard mask layer 58 can be from about 10 nm to about 150 nm, although lesser and greater thicknesses can also be employed.

A photoresist layer 59 is deposited as a blanket layer atop the antireflective hard mask layer 58, for example, by spin coating. The photoresist layer 59 can include any organic photoresist material such as, for example, methacrylates or polyesters. The photoresist layer 59 can have a thickness from about 30 nm to about 500 nm, although lesser and greater thicknesses can also be employed. The photoresist layer 59 is deposited in the MRAM region.

Figure 6:
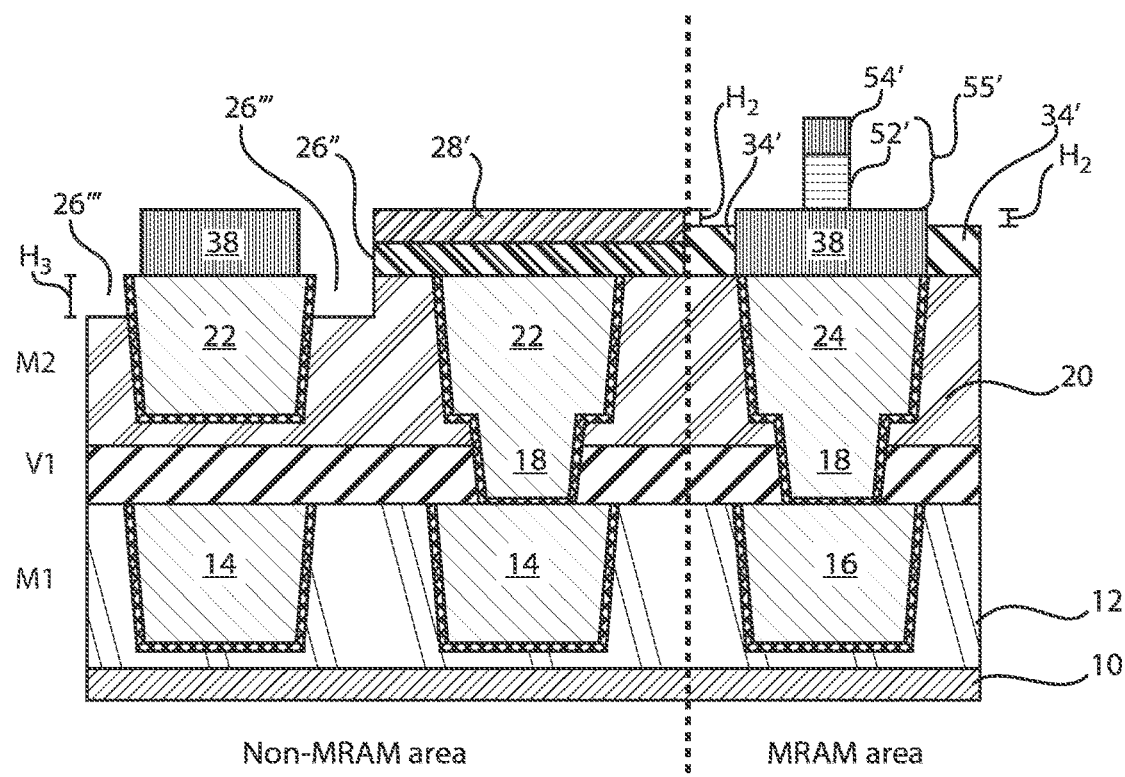
FIG. 6 is a cross-sectional view of the semiconductor structure of FIG. 5 where etching is performed to form MRAM pillars, in accordance with an embodiment of the present invention.

FIG. 6 is a cross-sectional view of the semiconductor structure of FIG. 5 where etching is performed to form MRAM pillars, in accordance with an embodiment of the present invention.

In various exemplary embodiments, MRAM pillars 55' can be formed. The MRAM pillars 55' are formed by removing the OPL 56, the antireflective hard mask layer 58, and the photoresist 59, and etching the top electrode 54 and the MTJ stack 52. Thus, top electrode portion 54' and MTJ stack portion 52' remain over the bottom electrode portion 38 in the MRAM region.

The top electrode 54 and the MTJ stack 52 can be simultaneously etched with a RIE and/or an Ion Beam Etching (IBE) process employing one or more gases including C, H, and 0 such as $CH_3OH$, $C_2H_5OH$ or a gas mixture including ammonia ($NH_3$) and carbon monoxide (CO), $NH_3$ and methane ($CH_4$) or $CH_3$ and ethylene ($C_2H_4$) as an etchant.

Additionally, the dielectric regions 34 are slightly recessed such that recessed dielectric regions 34' remain. The dielectric regions 34 can be recessed by an amount designated by "$H_2$." It is noted that the material loss of the dielectric regions 34 is more than the material loss of the dielectric hardmask 28', but less than the material loss 26'" of the dielectric uncovered by the metal hardmask 26". The material loss 26'" can be designated by "$H_3$."

Additionally, the bottom electrode portion 38 is exposed in the non-MRAM region. Further, the hardmask sections 26" and 28' are also exposed in the non-MRAM region. The metal hardmask 28' in the non-MRAM region protects the BEOL features from MRAM processing.

Figure 7:
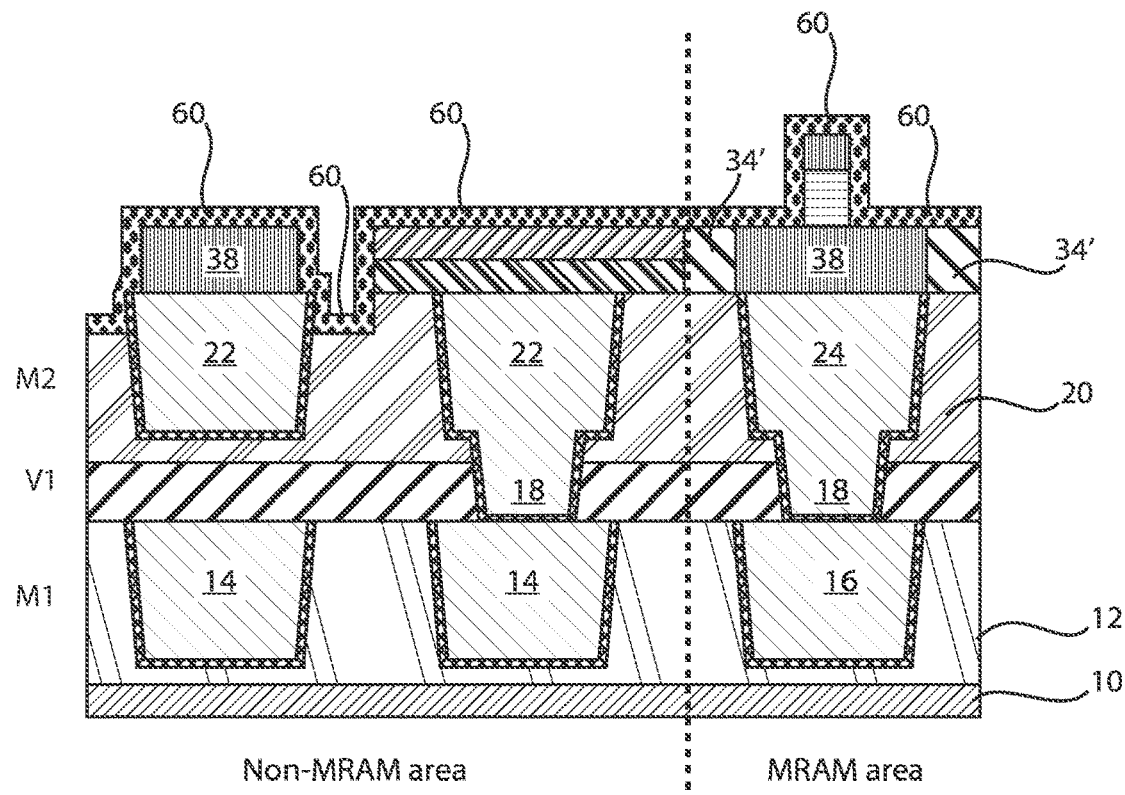
FIG. 7 is a cross-sectional view of the semiconductor structure of FIG. 6 where an encapsulation layer is deposited, in accordance with an embodiment of the present invention.

FIG. 7 is a cross-sectional view of the semiconductor structure of FIG. 6 where an encapsulation layer is deposited, in accordance with an embodiment of the present invention.

In various exemplary embodiments, an encapsulation layer 60 is deposited.

The encapsulation layer 60 can be deposited using a deposition process, for example, CVD or PVD. Non-limiting examples of materials for the encapsulation layer 60 include dielectric oxides (e.g., silicon dioxide), dielectric nitrides (e.g., $Si_xN_y$), dielectric oxynitrides (e.g., $SiO_xN_y$), or any combination thereof.

The encapsulation layer 60 can have a thickness that generally varies and depends on the type of material(s) and the type of device. In some embodiments, the encapsulation layer 60 has a thickness in a range from about 10 to about 100 nm. In other embodiments, the encapsulation layer 60 has a thickness in a range from about 20 to about 40 nm.

Figure 8:
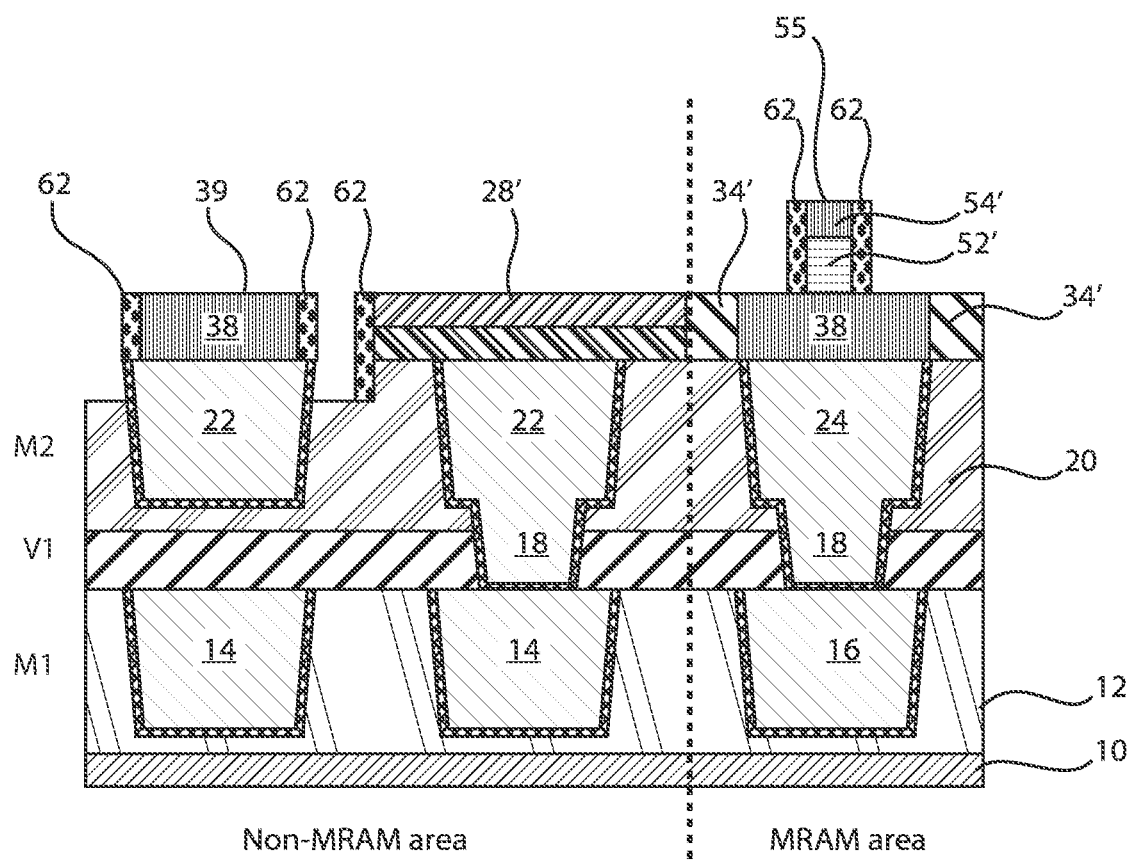
FIG. 8 is a cross-sectional view of the semiconductor structure of FIG. 7 where the encapsulation layer is etched for MRAM patterning, in accordance with an embodiment of the present invention.

FIG. 8 is a cross-sectional view of the semiconductor structure of FIG. 7 where the encapsulation layer is etched for MRAM patterning, in accordance with an embodiment of the present invention.

In various exemplary embodiments, the encapsulation layer 60 is etched such that encapsulation sections or protectors 62 remain adjacent the bottom electrode portion 38 in the non-MRAM region and an encapsulation section 62 remains adjacent the hardmasks 26", 28' in the non-MRAM region. Additionally, encapsulation sections 62 are formed adjacent the top electrode portion 54' and the MTJ stack portion 52' (collectively, the MRAM pillars 55'). Moreover, the etch results in exposure of the top surface 39 of the bottom electrode portion 38 in the non-MRAM region and exposure of the top surface 55 of the MRAM pillar 55'.

Figure 9:
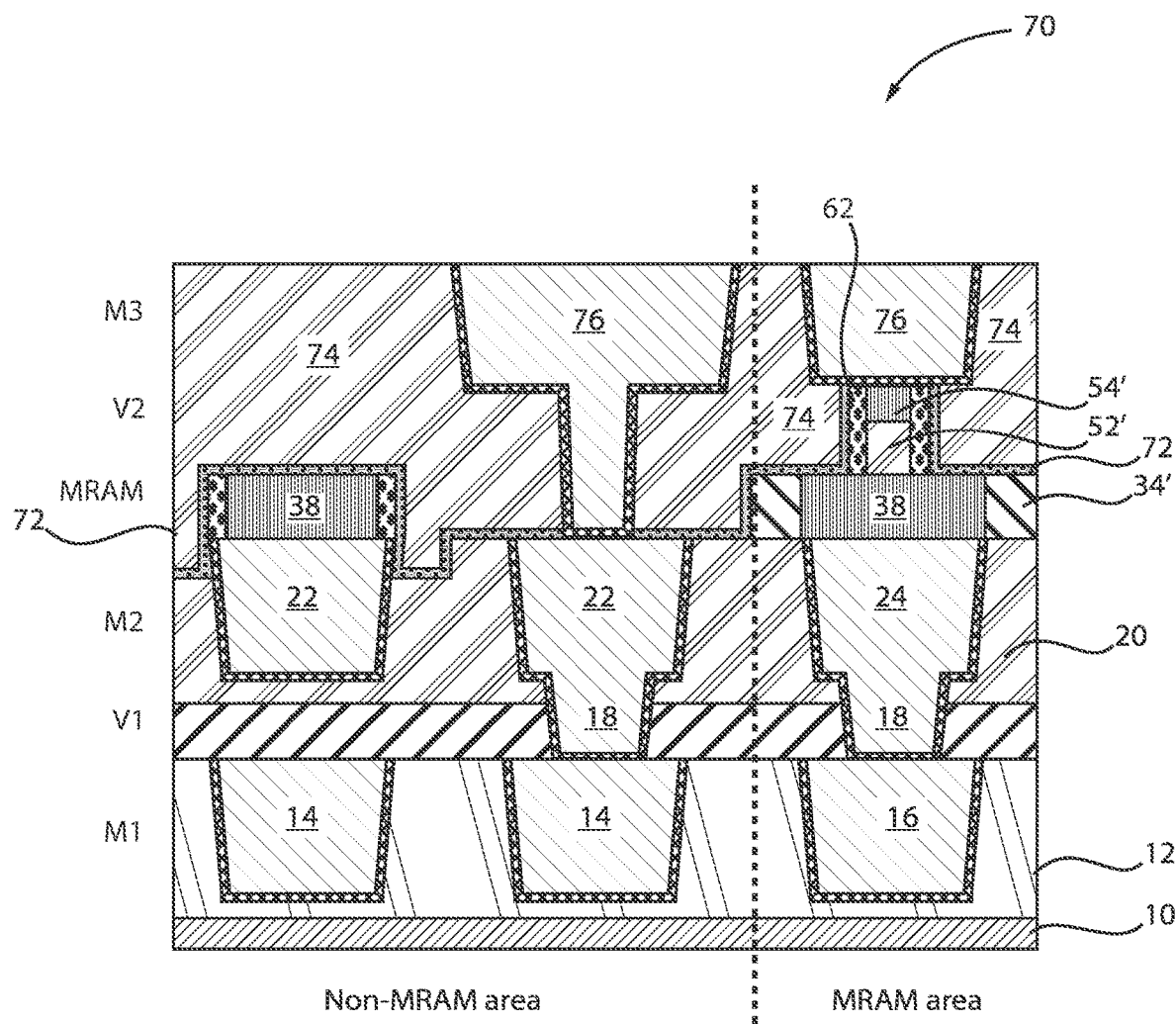
FIG. 9 is a cross-sectional view of the semiconductor structure of FIG. 8 where further metal levels are added, in accordance with an embodiment of the present invention.

FIG. 9 is a cross-sectional view of the semiconductor structure of FIG. 8 where further metal levels are added, in accordance with an embodiment of the present invention.

In various exemplary embodiments, in structure 70, a liner 72 is deposited, an ILD 74 is deposited over the liner 72, an opening is formed through the ILD 74 to the top surface of the top electrode portion 54', and the opening is filled with a conductive material 76. Additionally, a via is formed in the non-MRAM region to the metal level 2, the via filled with conductive material 76.

Therefore, in summary, selective dielectric or dielectric protectors are retained in the MRAM regions, but not in the BEOL regions. This provides structural protection through the MRAM process, while enabling a higher performance build in the standard BEOL regions. The process flow thus allows for protection on non-MRAM features or areas during high energy MTJ stack etches. The process flow further involves selective dielectric or dielectric protectors for preventing gouging in memory and MRAM applications.

In various exemplary embodiments, the liner 72 can be, e.g., TaN with different types of deposition such as PVD, CVD, ALD and with different resistance values. This material is not limited by other metal types such as TiN, W, or amorphous carbon (a-C), and dielectrics such as $Al_2O_3$, $HfO_2$, SiN, $ZrO_2$ etc.

In various exemplary embodiments, the layer 74 can be, e.g., a low-k dielectric layer. A low-k dielectric material as used in the low-k dielectric layer 74 can have a dielectric constant that is less than 4.0, e.g., 3.9. In one embodiment, the low-k material layer 74 can have a dielectric constant ranging from about 1.0 to about 3.5. In another embodiment, the low-k material layer 74 can have a dielectric constant ranging from about 1.75 to about 3.2.

One example of a material suitable for the low-k materials for the low-k dielectric layer 74 can include silicon oxycarbonitride (SiOCN). Other low-k materials that can also be used for the low-k material layer 74 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 74 can be conformally deposited using CVD. Variations of CVD processes suitable for forming the first dielectric layer include, but are not limited to, Atmospheric Pressure CVD (AP-CVD), Low Pressure CVD (LPCVD) and Plasma Enhanced CVD (PECVD), Metal-Organic CVD (MOCVD) and combinations thereof can also be employed. In some embodiments, the low-k dielectric layer 74 can have a thickness ranging from about 100 nm to about 120 nm.

In various example embodiments, the conductive material 76 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal 76 can be deposited by a suitable deposition process, for example, CVD, PECVD, PVD, plating, thermal or e-beam evaporation, or sputtering.

In various exemplary embodiments, the height of the conductive material 76 can be reduced by CMP and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

In summary, an MRAM structure is presented including an active MRAM device with a dielectric selectively deposited in areas adjacent to the active MRAM device, but not deposited in areas with standard BEOL wiring. The selective dielectric or dielectric protectors can be silicon oxide, aluminum oxide or hafnium oxide based, or a combination thereof. The selective dielectric or dielectric protectors can act as protective layers to preserve the integrity of underlying dielectrics. The selective dielectric or dielectric protectors reduce the lower electrode critical dimension (CD) to reduce metal re-sputtering during ion beam etch (IBE) and/or stack etch. The exemplary embodiments of the present invention further present a pillar based interconnect structure including an active device with a dielectric selectively deposited in areas adjacent to the active device, but not deposited in areas with standard BEOL wiring.

Regarding FIGS. 1-9, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for selective dielectric deposition to prevent gouging in magnetoresistive random access memory (MRAM) applications (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for reducing dielectric gouging during etching processes of a magnetoresistive random access memory (MRAM) structure including an MRAM region and a non-MRAM region, the method comprising:
    forming a plurality of first conductive lines within a first dielectric at a first metal level;
    forming a plurality of second conductive lines within a second dielectric at a second metal level, wherein the first and second metal levels are connected by a via;
    depositing a first hardmask and a second hardmask;
    etching the first and second hardmasks to expose top surfaces of one or more of the plurality of second conductive lines; and
    constructing protective layers in the MRAM region to preserve integrity of underlying dielectric layers, wherein the protective layers are misaligned with respect to conductive lines of the plurality of first and second conductive lines in the first and second metal levels, respectively.

2. The method of claim 1, wherein a bottom electrode is formed in direct contact with the protective layers.

3. The method of claim 2, wherein an MRAM pillar is constructed over the bottom electrode, and the MRAM pillar includes a magnetic tunnel junction (MTJ) stack and a top electrode.

4. The method of claim 3, wherein the protective layers include at least one of silicon oxide, aluminum oxide, or hafnium oxide, or a combination thereof.

5. The method of claim 4, wherein the protective layers reduce a critical dimension of the bottom electrode to reduce metal resputtering during ion beam etching.

6. The method of claim 5, wherein the protective layers prevent gouging in the MRAM region.

7. The method of claim 6, wherein the protective layers are vertically misaligned with respect to encapsulation protectors formed over the bottom electrode.

* * * * *